United States Patent
Yuzuriha

(10) Patent No.: US 8,987,355 B2
(45) Date of Patent: Mar. 24, 2015

(54) EPOXY RESIN COMPOSITION FOR SEALING, AND ELECTRONIC COMPONENT DEVICE

(75) Inventor: Yukiharu Yuzuriha, Utsunomiya (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 85 days.

(21) Appl. No.: 13/976,538

(22) PCT Filed: Jan. 26, 2012

(86) PCT No.: PCT/JP2012/051648
§ 371 (c)(1),
(2), (4) Date: Jun. 27, 2013

(87) PCT Pub. No.: WO2012/102336
PCT Pub. Date: Aug. 2, 2012

(65) Prior Publication Data
US 2013/0277867 A1    Oct. 24, 2013

(30) Foreign Application Priority Data

Jan. 28, 2011   (JP) ................................. 2011-016384

(51) Int. Cl.
| | | |
|---|---|---|
| C08K 7/18 | (2006.01) | |
| C08L 63/00 | (2006.01) | |
| H01L 23/29 | (2006.01) | |
| C08K 3/36 | (2006.01) | |
| H01L 23/31 | (2006.01) | |
| H01L 23/495 | (2006.01) | |
| C08G 59/62 | (2006.01) | |
| C08G 59/68 | (2006.01) | |
| C08G 59/40 | (2006.01) | |

(52) U.S. Cl.
CPC ................ *H01L 23/296* (2013.01); *C08K 3/36* (2013.01); *C08K 7/18* (2013.01); *H01L 23/295* (2013.01); *H01L 23/3107* (2013.01); *H01L 23/49575* (2013.01); *H01L 23/49586* (2013.01); *C08G 59/621* (2013.01); *C08G 59/688* (2013.01); *C08L 63/00* (2013.01); *C08G 59/4071* (2013.01); *H01L 2224/32145* (2013.01); *H01L 2224/32245* (2013.01); *H01L 2224/48145* (2013.01); *H01L 2224/48247* (2013.01); *H01L 2224/73265* (2013.01); *H01L 2224/48091* (2013.01); *H01L 2924/10253* (2013.01); *H01L 2924/15747* (2013.01)
USPC ............................ 523/466; 257/793; 525/481

(58) Field of Classification Search
None
See application file for complete search history.

(56) References Cited

U.S. PATENT DOCUMENTS

| | | | |
|---|---|---|---|
| 2006/0189721 A1 | 8/2006 | Akiyama et al. | |
| 2006/0216520 A1 | 9/2006 | Osada | |
| 2007/0232728 A1* | 10/2007 | Endo et al. | 523/457 |
| 2012/0061861 A1* | 3/2012 | Wada | 257/793 |

FOREIGN PATENT DOCUMENTS

| | | | |
|---|---|---|---|
| CN | 101379107 A | | 3/2009 |
| JP | 62-59626 A | | 3/1987 |
| JP | 2002-284859 A | | 10/2002 |
| JP | 2002-284859 A | * | 10/2002 |
| JP | 2006-169407 A | | 6/2006 |
| JP | 2006-225630 A | | 8/2006 |
| JP | 2006-299246 A | | 11/2006 |
| JP | 2007-262238 A | * | 10/2007 |
| JP | 2008-31326 A | * | 2/2008 |
| JP | 2008-63564 A | * | 3/2008 |
| JP | 2008-106230 A | * | 5/2008 |
| JP | 2008-231242 A | | 10/2008 |
| JP | 2008-231242 A | * | 10/2008 |
| JP | 2008-285592 A | | 11/2008 |
| JP | 2011-252086 A | | 12/2011 |
| WO | WO 2010/140331 A1 | * | 12/2010 |
| WO | WO 2010/140331 A1 | | 12/2010 |
| WO | WO 2012/029762 A1 | | 3/2012 |

OTHER PUBLICATIONS

International Search Report for PCT/JP2012/051648 dated Apr. 17, 2012.
Notification of First Office Action issued Oct. 29, 2014, in Chinese Patent 201280006193.0, with English translation.

* cited by examiner

*Primary Examiner* — Robert Sellers
(74) *Attorney, Agent, or Firm* — Birch, Stewart, Kolasch & Birch, LLP

(57) ABSTRACT

The present invention provides an epoxy resin composition for sealing that demonstrates favorable adhesion to a copper lead frame in which oxidation has progressed and has superior mold release and continuous moldability. The epoxy resin composition for sealing includes (A) an epoxy resin, (B) a phenolic resin-based curing agent, (C) an inorganic filler, and (D) a curing accelerator. The curing accelerator (D) has an average particle diameter of 10 μm or less, and the ratio of particles having a particle diameter in excess of 20 μm is 1% by weight or less. Also, the curing accelerator (D) includes at least one type of curing accelerator selected from the group consisting of a phosphobetaine compound having a specific structure; adduct of a phosphine compound having a specific structure, and quinone compound; and an adduct of a phosphonium compound having a specific structure, and a silane compound. An electronic component device in which an electronic component is sealed by a cured product of the aforementioned epoxy resin composition for sealing is provided.

20 Claims, 1 Drawing Sheet

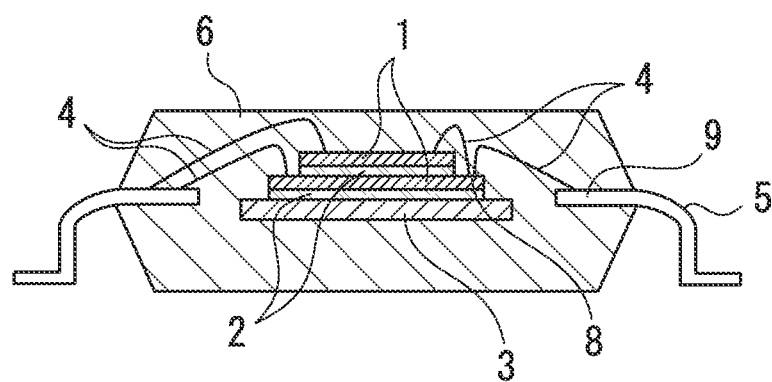

EPOXY RESIN COMPOSITION FOR SEALING, AND ELECTRONIC COMPONENT DEVICE

TECHNICAL FIELD

The present invention relates to an epoxy resin composition for sealing and an electronic component device. More particularly, the present invention relates to an epoxy resin composition for sealing having superior adhesion to copper in which oxidation has progressed in the case of using a copper lead frame as well as superior mold release with a molding die, and relates to an electronic component device in which an electronic component is sealed by a cured product of the epoxy resin composition for sealing.

The present application claims priority on the basis of Japanese Patent Application No. 2011-016384, filed in Japan on Jan. 28, 2011, the contents of which are incorporated herein by reference.

BACKGROUND ART

In the assembly process of electronic component devices (to be referred to as "packages"), a technique is primarily employed that consists of electrically connecting an aluminum electrode of a semiconductor element (to be referred to as a "semiconductor chip") and the inner lead of a lead frame by thermocompression bonding of a bonding wire between the two. In addition, accompanying the recent market trends of reduced size, lighter weight and higher performance, electronic components are continuing to demonstrate higher levels of integration and multiple pins. Consequently, increasingly complex wire bonding steps are being required more than ever before, and in the case of using a copper lead frame, oxidation of the copper surface is progressing to a greater degree as a result of being exposed to high temperatures of 200° C. to 250° C. for long periods of time.

If a conventional sealing material having superior adhesion to unoxidized copper surfaces is used under such conditions, since there are many cases in which adhesion to copper in various surface states in which oxidation has progressed is inferior, there is the problem of the occurrence of separation at the interface between the sealing resin cured product and the lead frame during demolding after sealing and molding the resin and during solder reflow.

In order to inhibit this separation, since improving adhesion between an insert such as the lead frame and the sealing resin cured product is in opposition to improving mold release of the sealing resin cured product from a molding die, when adhesion with an insert such as the lead frame is improved, mold release from the molding die becomes inferior resulting in the problem of decreased moldability.

Prior to the problem of oxidation of a copper lead frame attributable to higher levels of integration of electronic components, a technique was proposed that consisted of the use of a powder composed of a specific quaternary phosphonium salt as a curing accelerator from the viewpoints of curability and soldering heat resistance (see, for example, Patent Documents 1 and 2). According to this technique, although adhesion and mold release with respect to unoxidized copper were superior, there was the problem of decreased adhesive strength of the sealing resin to an oxidized copper frame.

PRIOR ART DOCUMENTS

Patent Documents

Patent Document 1: Japanese Unexamined Patent Application, First Publication No. 2008-285592
Patent Document 2: Japanese Unexamined Patent Application, First Publication No. 2002-284859

SUMMARY OF THE INVENTION

Problems to be Solved by the Invention

With the foregoing in view, an object of the present invention is to provide an epoxy resin composition for sealing that demonstrates favorable adhesion to a copper lead frame in which oxidation has progressed and has superior mold release and continuous moldability, and an electronic component device in which an electronic component is sealed by a cured product thereof.

Means for Solving the Problems

As a result of conducting extensive studies to solve the aforementioned problems, the inventors of the present invention found that the aforementioned objects can be achieved by using at least one type of curing accelerator selected from the group consisting of a specific phosphobetaine compound, adduct of a phosphine compound and quinone compound, and an adduct of a phosphonium compound and a silane compound in an epoxy resin compound for sealing, and adjusting to a specific particle size distribution; thereby leading to completion of the present invention.

The epoxy resin composition for sealing of the present invention is an epoxy resin composition for sealing including (A) an epoxy resin, (B) a phenolic resin-based curing agent, (C) an inorganic filler, and (D) a curing accelerator, in which
the curing accelerator (D) has an average particle diameter of 10 μm or less, and the ratio of particles having a particle diameter in excess of 20 μm is 1% by weight or less, and
the curing accelerator (D) includes at least one type of curing accelerator selected from the group consisting of a compound represented by the following general formula (1):

[Chemical Formula 1]

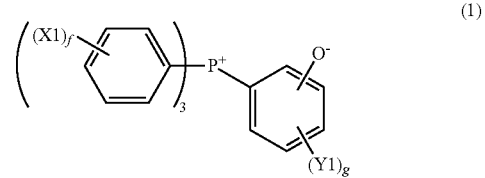

(in which, P represents a phosphorous atom, X1 represents an alkyl group having 1 to 3 carbon atoms, Y1 represents a hydroxyl group, f represents an integer of 0 to 5, and g represents an integer of 0 to 3),
a compound represented by the following general formula (2):

[Chemical Formula 2]

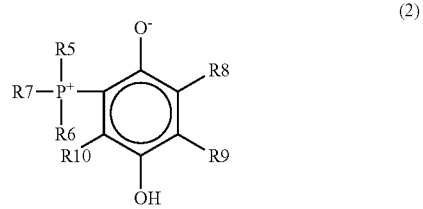

(in which, P represents a phosphorous atom, R5, R6 and R7 represent alkyl groups having 1 to 12 carbon atoms or aryl groups having 6 to 12 carbon atoms and may be mutually the same or different, R8, R9 and R10 represent hydrogen atoms or hydrocarbon groups having 1 to 12 carbon atoms and may be mutually the same or different, and R8 and R9 may bond to form a cyclic structure), and a compound represented by the following general formula (3):

[Chemical Formula 3]

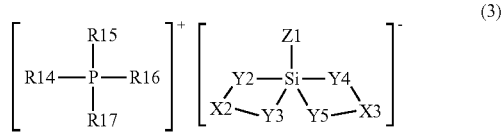

(3)

(in which, P represents a phosphorous atom; Si represents a silicon atom; R14, R15, R16 and R17 respectively represent an organic group having an aromatic ring or heterocycle, or an aliphatic group, and may be mutually the same or different; X2 represents an organic group that bonds with groups Y2 and Y3; X3 represents an organic group that bonds with groups Y4 and Y5; groups Y2 and Y3 represent groups obtained by the release of a proton by a proton-donating group and groups Y2 and Y3 within the same molecule bond with a silicon atom to form a chelating structure; groups Y4 and Y5 represent groups obtained by the release of a proton by a proton-donating group and groups Y4 and Y5 within the same molecule bond with a silicon atom to form a chelating structure; X2 and X3 may be mutually the same or different; groups Y2, Y3, Y4 and Y5 may be mutually the same or different; and Z1 represents an organic group having an aromatic ring or heterocycle, or an aliphatic group).

The epoxy resin composition for sealing of the present invention can be made to have adhesive strength with oxidized copper of 14 N or more as determined in the measurement experiment described below.

<Measurement Experiment>

After integrally molding an oxidized copper base material, in which oxidization of the surface has progressed as a result of subjecting to heat treatment in air at 220° C. for 120 seconds, and the tableted aforementioned epoxy resin composition under conditions of 175° C. and 6.9 MPa for 2 minutes to obtain a molded product in the shape of a circular truncated cone (measuring 3 mm in upper diameter×3.6 mm in lower diameter×3 mm thick, contact surface area between oxidized copper base material and resin cured product: 10 mm²) on the oxidized copper base material (diameter: 3.6 mm, thickness: 0.5 mm), the cured site of the aforementioned epoxy resin composition was pressed from the horizontal direction followed by measurement of that torque (N).

The epoxy resin composition for sealing of the present invention can be applied to a copper surface or oxidized copper surface.

In the epoxy resin composition for sealing of the present invention, the aforementioned inorganic filler (C) can contain molten spherical silica having an average particle diameter of 10 µm to 30 µm.

In the epoxy resin composition for sealing of the present invention, the aforementioned molten spherical silica can be contained at a ratio of 82% by weight to 92% by weight in the entire resin composition.

In the epoxy resin composition for sealing of the present invention, the aforementioned epoxy resin (A) can contain a bifunctional crystalline epoxy resin.

The electronic component device of the present invention includes an electronic component sealed by a cured product of the aforementioned epoxy resin composition for sealing.

In the electronic component device of the present invention, the aforementioned electronic component can be mounted on a die pad of a copper lead frame, and the electrode pad of the electronic component and the inner lead of the copper lead frame can be connected by a bonding wire.

In the electronic component device of the present invention, two or more of the aforementioned electronic components can be mounted by laminating on the die pad of the copper lead frame.

Effects of the Invention

According to the present invention, an epoxy resin composition for sealing can be obtained that demonstrates superior adhesion to a copper lead frame in which oxidation has progressed as well as superior mold release and continuous moldability during molding. In addition, an electronic component device having superior reliability can be obtained in which an electronic component such as an IC or LSI is sealed by this epoxy resin composition for sealing.

BRIEF DESCRIPTION OF THE DRAWINGS

FIG. 1 is a drawing showing the cross-sectional structure of an example of an electronic component device that uses the epoxy resin composition for sealing according to the present invention.

DESCRIPTION OF EMBODIMENTS

The epoxy resin composition for sealing of the present invention is an epoxy resin composition for sealing including (A) an epoxy resin, (B) a phenolic resin-based curing agent, (C) an inorganic filler, and (D) a curing accelerator, in which the curing accelerator (D) has an average particle diameter of 10 µm or less and the ratio of particles having an average diameter in excess of 20 µm is 1% by weight or less, and the curing accelerator (D) includes at least one type of curing accelerator selected from the group consisting of a compound represented by general formula (1), a compound represented by general formula (2), and a compound represented by general formula (3). As a result, an epoxy resin composition for sealing can be obtained that demonstrates superior adhesion with a copper lead frame in which oxidation has progressed as well as superior mold release and continuous moldability during molding. In addition, the electronic component device of the present invention includes an electronic component such as an IC or LSI that is sealed by this epoxy resin composition for sealing. As a result, an electronic component device can be obtained that has superior reliability. The following provides a detailed explanation of the present invention.

First, an explanation is provided of the epoxy resin composition for sealing of the present invention. The epoxy resin of component (A) used in the epoxy resin composition for sealing of the present invention is that commonly used in epoxy resin compositions for sealing, and although there are no particular limitations thereon, examples thereof include epoxidized novolac resins such as phenol novolac epoxy resins or orthocresol novolac epoxy resins obtained by condensing or co-condensing phenols such as phenol, cresol, xylenol, resorcinol, catechol, bisphenol A or bisphenol F and/or naphthols such as α-naphthol, β-naphthol or dihydroxynaphthalene with a compound having an aldehyde group such as formaldehyde, acetoaldehyde, propionaldehyde, benzaldehyde or salicylaldehyde in the presence of an acidic catalyst, diglycidyl ethers such as bisphenol A, bisphenol F, bisphenol S or bisphenol A/D, diglycidyl ethers of alkyl-substituted or unsubstituted bisphenols in the form of biphenyl epoxy resins, epoxidates of phenol aralkyl resins synthesized from phenols and/or naphthols and dimethoxyparaxylene, bis(methoxymethyl)biphenyl, bis(haloparaxylene) or bis(halomethylbiphenyl), stilbene epoxy resin, hydroquinone epoxy resin, glycidyl ether epoxy resins obtained by reacting a polybasic acid such as phthalic acid or dimer acid with epichlorhydrin, glycidyl amine epoxy resins obtained by reacting a polyamine such as diaminodiphenylmethane or isocyanuric acid with epichlorhydrin, epoxidates of dicyclopentadiene and co-condensed resins such as phenols in the form of dicyclopentadiene epoxy resins, epoxy resins having a naphthalene ring, triphenolmethane epoxy resin, trimethylolpropane epoxy resin, terpenic epoxy resins, linear aliphatic epoxy resins obtained by oxidizing a 1-alkene bond with a peracid such as peracetic acid, alicyclic epoxy resins, and epoxy resins obtained by denaturing these epoxy resins with silicone, acrylonitrile, butadiene, isoprene rubber or polyamide resin, and these may be used alone or two or more types may be used in combination. In particular, bisphenol epoxy resins such as bisphenol A epoxy resin, bisphenol F epoxy resin, tetraalkyl-substituted bisphenol A epoxy resin or tetraalkyl-substituted bisphenol F epoxy resin, and bifunctional crystalline epoxy resins such as biphenyl epoxy resins are preferable, and biphenyl epoxy resins are particularly preferable from the viewpoint of adhesion with copper in which oxidation has progressed.

Although there are no particular limitations on the ratio at which component (A) used in the epoxy resin composition for sealing of the present invention is incorporated based on the total weight of the epoxy resin composition for sealing, it is preferably 1% by weight to 15% by weight and more preferably 2% by weight to 10% by weight based on the total weight of the epoxy resin composition for sealing. If the incorporated ratio of component (A) in the entire epoxy resin composition is equal to or greater than the aforementioned lower limit value, there is little risk of inducing a decrease in fluidity and the like. If the incorporated ratio of component (A) in the entire epoxy resin composition is equal to or less than the aforementioned upper limit value, there is little risk of inducing a decrease in soldering resistance and the like.

The phenolic resin-based curing agent of component (B) used in the epoxy resin composition for sealing of the present invention is that commonly used in epoxy resin compositions for sealing, and although there are no particular limitations thereon, examples thereof include resins such as phenol novolac resins or cresol novolac resins obtained by condensing or co-condensing phenols such as phenol, cresol, resorcinol, catechol, bisphenol A, bisphenol F phenylphenol or aminophenol and/or naphthols such as α-naphthol, β-naphthol or dihydroxynaphthalene with a compound having an aldehyde group such as formaldehyde, acetoaldehyde, propionaldehyde, benzaldehyde or salicylaldehyde in the presence of an acidic catalyst, and phenol aralkyl resins synthesized from phenols and/or naphthols and dimethoxyparaxylene, bis(methoxymethyl)biphenyl, bis(haloparaxylene) or bis(halomethylbiphenyl), and these may be used alone or two or more types may be used in combination. In particular, phenol aralkyl resins are particularly preferable from the viewpoint of adhesion with copper in which oxidation has progressed.

Although there are no particular limitations on the ratio at which the phenolic resin-based curing agent of component (B) is incorporated in the epoxy resin composition for curing of the present invention, it is preferably 0.5% by weight to 12% by weight and particularly preferably 1% by weight to 9% by weight based on the total weight of the epoxy resin composition for sealing. If the incorporated ratio of the phenolic resin-based curing agent of component (B) is equal to or greater than the aforementioned lower limit value, there is little risk of inducing a decrease in fluidity and the like. If the incorporated ratio of the phenolic resin-based curing agent of component (B) is equal to or less than the aforementioned upper limit value, there is little risk of inducing a decrease in soldering resistance and the like.

Although there are no particular limitations on the equivalent ratio between the epoxy resin of component (A) and the phenolic resin-based curing agent of component (B), namely the ratio of the number of epoxy groups in the epoxy resin to the number of hydroxyl groups in the phenolic resin-based curing agent, it is preferably set to within the range of 0.5 to 2, and more preferably set to within the range of 0.6 to 1.5, in order to minimize the respective amounts of unreacted components. In addition, it is more preferably set to a range of 0.8 to 1.4 in order to obtain an epoxy resin composition for sealing having superior moldability and reflow resistance.

The inorganic filler of component (C) used in the epoxy resin composition for sealing of the present invention is incorporated in the epoxy resin composition for sealing in order to, for example, reduce moisture absorption, reduce linear coefficient of expansion, improve thermal conductivity and improve strength, and examples thereof include powders such as molten silica, crystalline silica, alumina, calcium silicate, calcium carbonate, potassium titanate, silicon carbide, silicon nitride, aluminum nitride, boron nitride, beryllia, zirconia, zircon, forsterite, steatite, spinel, mullite or titania, spherical beads thereof and glass fibers. Moreover, examples of inorganic fillers having flame retardation effects include aluminum hydroxide, magnesium hydroxide, zinc borate and zinc molybdenate. One type of these inorganic fillers may be used alone or two or more types may be used in combination. Among the aforementioned inorganic fillers, molten silica is preferable from the viewpoint of reducing linear coefficient of expansion, alumina is preferable from the viewpoint of high thermal conductivity, and the shape of the filler is preferably spherical from the viewpoint of fluidity during molding and mold wear resistance.

The incorporated amount of the inorganic filler (C) is preferably within the range of 80% by weight to 96% by weight, more preferably within the range of 82% by weight to 92% by weight, and even more preferably within the range of 86% by weight to 90% by weight from the viewpoints of moldability, moisture absorption, reducing linear coefficient of expansion and improving strength. If the incorporated amount is less than the lower limit value, reliability tends to decrease, while if the incorporated amount exceeds the upper limit value, moldability tends to decrease.

The curing accelerator of component (D) used in the present invention preferably has an average particle diameter of 10 μm or less, and the ratio of particles having a particle diameter in excess of 20 μm is preferably 1% by weight or less. In the case the average particle diameter exceeds 10 μm or the ratio of particles having a particle diameter in excess of 20 μm exceeds 1% by weight of the total weight of the curing accelerator of component (D), the effect of improving curability is inadequate unless the incorporated amount of curing accelerator is increased, while conversely, storage stability and fluidity become inferior if the incorporated amount of curing accelerator is increased to a degree that allows the obtaining of adequate curability, thereby making it difficult to achieve balance between curability and fluidity. In order to make the average particle diameter of the curing accelerator to be 10 μm or less and the ratio of particles having a particle diameter in excess of 20 μm to be 1% by weight or less of the total weight of the curing accelerator, the curing accelerator is finely crushed using a crushing device so as not to cause generation of heat and melting. Examples of crushing devices that can be used include airflow pulverizers such as a jet mill, ball mills such as a vibrating ball mill, continuous rotary ball mill or batch-type ball mill, pulverizers, hammer mills, pot mills such as a wet pot mill or planetary pot mill, and roller mills. Among these, a jet mill, ball mill, hammer mill and pot mill are preferable, and a jet mill is particularly preferable. As a result, the curing accelerator can be finely crushed particularly efficiently.

In the case of using a jet mill to finely crush the curing accelerator, although there are no particular limitations thereon, crushing conditions preferably include pneumatic pressure of 0.5 MPa to 1.0 MPa and particularly preferably 0.6 MPa to 0.8 MPa. Although there are no particular limitations on the rate at which the second set of components is supplied, it is preferably 1 kg/h to 100 kg/h and particularly preferably 3 kg/h to 50 kg/h.

In addition, when finely crushing the curing accelerator, the curing accelerator can be finely crushed after adding a portion (small amount) of a mold release agent and/or inorganic filler to the curing accelerator from the viewpoint of workability. As a result, even in cases in which the melting point of the curing accelerator is comparatively low, adhesion of the curing accelerator to the walls and so forth of the crushing device can be prevented.

Furthermore, particle diameter of the curing accelerator can be measured using, for example, a commercially available laser particle size analyzer (such as the Model SALD-7000 manufactured by Shimadzu Corp.).

In the epoxy resin composition for sealing of the present invention, the curing accelerator of component (D) preferably includes at least one type of curing accelerator selected from the group consisting of a phosphobetaine compound, an adduct of a phosphine compound and quinone compound, and an adduct of a phosphonium compound and a silane compound. By using these curing accelerators after adjusting so that the average particle diameter thereof is 10 µm or less and the ratio of particles having a particle diameter of 20 µm or less is 1% by weight or less of the total weight of the curing accelerator, an epoxy resin composition for sealing can be obtained that has particularly superior balance between curability and fluidity, superior adhesion to a copper lead frame in which oxidation has progressed, and superior mold release and continuous moldability during molding.

Examples of the phosphobetaine compound include compounds represented by the following general formula (1):

[Chemical Formula 4]

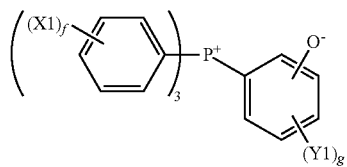

(in which, P represents a phosphorous atom, X1 represents an alkyl group having 1 to 3 carbon atoms, Y1 represents a hydroxyl group, f represents an integer of 0 to 5, and g represents an integer of 0 to 3).

Examples of the X1 group of compounds represented by general formula (1) include a methyl group, ethyl group, propyl group and isopropyl group. In addition, examples of the Y1 group of compounds represented by general formula (1) include a hydroxyl group. From the viewpoint of curability, compounds represented by general formula (1) are preferably unsubstituted such that f is 0 and g is 0, and more preferably have a structure in which the binding site of O⁻ relative to the binding site of P⁺ is the ortho position.

Compounds represented by general formula (1) can be obtained, for example, in the manner described below. First, a tertiary phosphine in the form of a tri-aromatic-substituted phosphine is contacted with a diazonium group of a diazonium salt, followed by substituting the tri-aromatic-substituted phosphine and the diazonium group of the diazonium salt. However, the method used to obtain compounds represented by general formula (1) is not limited thereto.

Examples of the adduct of a phosphine compound and quinone compound include compounds represented by the following general formula (2):

[Chemical Formula 5]

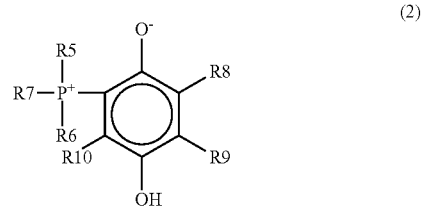

(in which, P represents a phosphorous atom, R5, R6 and R7 represent alkyl groups having 1 to 12 carbon atoms or aryl groups having 6 to 12 carbon atoms and may be mutually the same or different, R8, R9 and R10 represent hydrogen atoms or hydrocarbon groups having 1 to 12 carbon atoms and may be mutually the same or different, and R8 and R9 may bond to form a cyclic structure).

Phosphine compounds used in the adduct of a phosphine compound and a quinone compound are preferably unsubstituted (namely, hydrogen atoms) or have a substituent such as an alkyl group or alkoxy group on an aromatic ring, and examples thereof include triphenylphosphine, tris(alkylphenyl)phosphine, tris(alkoxyphenyl)phosphine, trinaphthylphosphine and tris(benzyl)phosphine, while examples of substituents such as an alkyl group or alkoxy group include those having 1 to 6 carbon atoms. Triphenylphosphine is preferable from the viewpoint of availability. In addition, examples of quinone compounds used in the adduct of a phosphine compound and a quinone compound include o-benzoquinone, p-benzoquinone and anthraquinones, while p-benzoquinone is particularly preferable from the viewpoint of storage stability. Among compounds represented by general formula (2), a compound in which R5, R6 and R7 bound to the phosphorous atom are phenyl groups and R8, R9 and R10 are hydrogen atoms, namely a compound obtained by the addition of 1,4-benzoquinone and triphenylphosphine, is preferable from the viewpoint of being able to maintain a low elastic modulus during heating of the cured product of the resin composition for sealing.

As an example of a method for producing the adduct of a phosphine compound and a quinone compound, the adduct can be obtained by contacting and mixing an organic tertiary phosphine compound and benzoquinone in a solvent capable of dissolving both compounds. The solvent is preferably a ketone such as acetone or methyl ethyl ketone that has low solubility with respect to the adduct. However, the solvent is not limited thereto.

Examples of the adduct of a phosphonium compound and a silane compound include compounds represented by the following general formula (3):

[Chemical Formula 6]

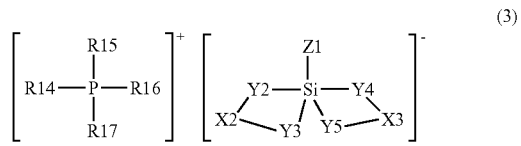

(3)

(in which, P represents a phosphorous atom; Si represents a silicon atom; R14, R15, R16 and R17 respectively represent an organic group having an aromatic ring or heterocycle, or an aliphatic group, and may be mutually the same or different; X2 represents an organic group that bonds with groups Y2 and Y3; X3 represents an organic group that bonds with groups Y4 and Y5; groups Y2 and Y3 represent groups obtained by the release of a proton by a proton-donating group and groups Y2 and Y3 within the same molecule bond with a silicon atom to form a chelating structure; groups Y4 and Y5 represent groups obtained by the release of a proton by a proton-donating group and groups Y4 and Y5 within the same molecule bond with a silicon atom to form a chelating structure; X2 and X3 may be mutually the same or different; groups Y2, Y3, Y4 and Y5 may be mutually the same or different; and Z1 represents an organic group having an aromatic ring or heterocycle, or an aliphatic group).

In general formula (3), examples of R14, R15, R16 and R17 include a phenyl group, methylphenyl group, methoxyphenyl group, hydroxyphenyl group, naphthyl group, hydroxynaphthyl group, benzyl group, methyl group, ethyl group, n-butyl group, n-octyl group and cyclohexyl group, and among these, an aromatic group having a substituent such as an alkyl group, alkoxy group or hydroxyl group or an unsubstituted aromatic group is more preferable, examples of which include a phenyl group, methylphenyl group, methoxyphenyl group, hydroxyphenyl group and hydroxynaphthyl group.

In addition, in general formula (3), X2 represents an organic group that bonds with Y2 and Y3. Similarly, X3 is an organic group that bonds with groups Y4 and Y5. Y2 and Y3 are groups obtained by the release of a proton by a proton-donating group, and Y2 and Y3 within the same molecule bond with a silicon atom to form a chelating structure. Similarly, Y4 and Y5 are groups obtained by the release of a proton by a proton-donating group, and Y4 and Y5 within the same molecule bond with a silicon atom to form a chelating structure. Groups X2 and X3 may be mutually the same or different, and groups Y2, Y3, Y4 and Y5 may also be mutually the same or different. Such groups represented by—Y2-X2-Y3- and—Y4-X3-Y5- in general formula (3) are composed of groups obtained by the release of two proteins by a proton-donating group. The proton donor is preferably a compound having two or more hydroxyl groups or carboxyl groups in a molecule thereof, more preferably an aromatic compound having two or more hydroxyl groups or carboxyl groups in a molecule thereof, furthermore preferably an aromatic compound having two or more hydroxyl groups or carboxyl groups as substituents on adjacent carbons that compose the aromatic ring, and most preferably an aromatic compound having two or more hydroxyl groups as substituents on adjacent carbons that compose the aromatic ring. Although examples of such proton donors include catechol, pyrogallol, 1,2-dihydroxynaphthalene, 2,3-dihydroxynaphthalene, 2,2'-biphenol, 1,1'-bi-2-naphthol, salicylic acid, 1-hydroxy-2-naphthoic acid, 3-hydroxy-2-naphthoic acid, chloranilic acid, tannic acid, 2-hydroxybenzyl alcohol, 1,2-cyclohexanediol, 1,2-propanediol and glycerin, among these, catechol, 1,2-dihydroxynaphthalene and 2,3-dihydroxynaphthalene are more preferable.

In addition, Z1 in general formula (3) represents an organic group having an aromatic ring or heterocycle, or an aliphatic group. Although specific examples thereof include aliphatic hydrocarbon groups such as a methyl group, ethyl group, propyl group, butyl group or hexyl group, aromatic hydrocarbon groups such as a phenyl group, benzyl group or naphthyl group, and reactive substituents in which a glycidyloxy group, mercapto group, amino group or vinyl group and the like is substituted in an alkyl group or aromatic group, such as a glycidyloxypropyl group, mercaptopropyl group, aminopropyl group, vinyl group or styryl group; among these, a methyl group, ethyl group, phenyl group, naphthyl group and phenyl group are more preferable from the viewpoint of improving the thermal stability of compounds represented by general formula (3).

A method for producing the adduct of a phosphonium compound and a silane compound consists of adding a silane compound such as phenyltrimethoxysilane and a proton donor such as catechol to a flask containing methanol and dissolving therein, followed by dropping in a sodium methoxide-methanol solution while stirring at room temperature. Moreover, a preliminarily prepared tetra-substituted phosphonium halide such as tetraphenylphosphonium bromide is dropped into the flask while stirring the solution dissolved in methanol at room temperature to precipitate crystals. The precipitated crystals are then filtered, rinsed with water and vacuum-dried to obtain an adduct of a phosphonium compound and a silane compound. However, the production method is not limited thereto.

The incorporated amount of the curing accelerator of component (D) based on the total weight of the epoxy resin composition for sealing of the present invention is preferably 0.1% by weight to 1% by weight based on the total weight of the resin composition. If the content of the curing accelerator is within the aforementioned range, adequate fluidity, storage stability and curability can be obtained.

Although the resin composition that composes a resin molded product of the present invention includes (A) an epoxy resin, (B) a phenolic resin-based curing agent, (C) an inorganic filler, and (D) a curing accelerator, a flame retardant such as brominated epoxy resin, antimony oxide, phosphate ester, phosphazene, aluminum hydroxide or magnesium hydroxide; an ion scavenger such as hydrotalcite; a colorant such as carbon black, red iron oxide or titanium oxide; a mold release agent such as a natural wax such as carnauba wax, a synthetic wax such as polyethylene wax, a higher fatty acid or metal salt thereof such as stearic acid or zinc stearate, or paraffin; a stress reducing agent such as silicone oil or silicone rubber; or a silane coupling agent and the like used in ordinary sealing materials may be suitably contained as necessary.

In the case of the epoxy resin composition for sealing of the present invention, the curing accelerator of component (D), either used alone or by adding a portion (small amount) of mold release agent and/or inorganic filler thereto as necessary, is first preliminarily crushed using a crushing device so as not to cause generation of heat and melting so that the average particle diameter is 10 μm or less and the ratio of particles having a particle diameter in excess of 20 μm is 1% by weight or less of the total weight of the curing accelerator. Subsequently, after adequately mixing the prescribed incorporated amounts of raw materials with a mixer and the like, the mixture is melted and kneaded with a mixing roller, kneader or extruder and the like, followed by cooling and crushing. The resulting composition is easier to use if formed into tablets of dimensions and weight that match molding conditions.

In addition, the epoxy resin composition for sealing of the present invention can also be used as an epoxy resin composition for sealing by dissolving in various types of organic solvents. In this case, an epoxy resin composition for sealing in the form of a sheet or film can be obtained and used by thinly coating the epoxy resin composition for sealing on a plate or film and dispersing an organic solvent under conditions that do not allow the resin curing reaction to proceed significantly.

Next, an explanation is provided of the electronic component device of the present invention based on FIG. 1. An example of an electronic component device obtained by sealing electronic components 1 with an epoxy resin composition for sealing 6 obtained in the present invention is an electronic component device obtained by mounting electronic components 1 such as a semiconductor chip, transistor, diode or thyristor on a support member (die pad 3) of a copper lead frame, and sealing the required portions with the epoxy resin composition for sealing 6 of the present invention. Examples of such an electronic component device include packages in which chips are laminated in multiple layers, such as a dual inline package (DIP), plastic leaded chip carrier (PLCC), quad flat package (QFP), small outline package (SOP), small outline J-lead package (SOJ), thin small outline package (TSOP) or thin quad flat package (TQFP), obtained by immobilizing the electronic components 1 on a copper lead frame and connecting a terminal portion (electrode pad 8) of the electronic components 1 such as a bonding pad and an inner lead 9 of a lead portion 5 with bonding wires 4 or bumps, followed by sealing the electronic components 1 by transfer molding and the like using the epoxy resin composition for sealing 6 of the present invention. In addition, another example of a package if a package in which chips are laminated in multiple layers such as a multi-chip stacked package (MCP).

Although low-pressure transfer molding is most commonly used to seal electronic components using the epoxy resin composition for sealing of the present invention, injection molding or compression molding and the like may also be used. In the case the epoxy resin composition for sealing is a liquid or paste at normal temperatures, sealing may also be carried out by dispensing, casting or printing.

Moreover, in addition to typical sealing methods used to directly seal electronic components in resin, a hollow package method can also be used in which the epoxy resin composition for sealing does not contact the electronic components, and the epoxy resin composition for sealing of the present invention can also be preferably used as an epoxy resin composition for sealing for use in a hollow package in the case of this method as well.

EXAMPLES

Although the following provides a detailed explanation of the present invention using examples thereof, the present invention is not limited thereto.

The structures of curing accelerators used in the examples and comparative examples are indicated below.

Furthermore, the average particle diameter, maximum particle diameter and ratio of particles having a particle diameter in excess of 20 μm of each of the curing accelerators were measured with a laser particle size analyzer (Model SALD-7000, Shimadzu Corp.).

Curing accelerator (D-1B): Compound represented by the following formula (D-1) obtained by adding 1,4-benzoquinone and triphenylphosphine (average particle diameter: 36 μm, maximum particle diameter: 85 μm, ratio of particles having particle diameter in excess of 20 μm: 68% by weight)

Curing accelerator (D-1A): Obtained by finely crushing curing accelerator (D-1B) using a jet mill (PJM200SP, Nippon Pneumatic Mfg., Co., Ltd.) under conditions of pneumatic pressure of 0.6 MPa and raw material supply rate of 3 kg/h. The resulting curing accelerator (D-1A) had an average particle diameter of 3 μm, maximum particle diameter of 24 μm and the ratio of particles having a particle diameter in excess of 20 μm was 0.5% by weight.

[Chemical 7]

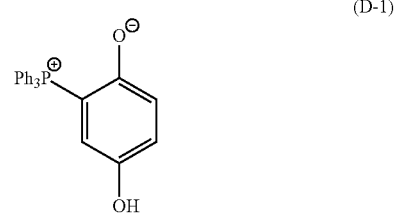

(D-1)

Curing accelerator (D-2B): 2-triphenylphosphoniophenolate represented by the following formula (D-2) (average particle diameter: 28 μm, maximum particle diameter: 77 μm, ratio of particles having particle diameter in excess of 20 μm: 64% by weight)

Curing accelerator (D-2A): Obtained by finely crushing curing accelerator (D-2B) using a jet mill (PJM200SP, Nippon Pneumatic Mfg., Co., Ltd.) under conditions of pneumatic pressure of 0.6 MPa and raw material supply rate of 3 kg/h. The resulting curing accelerator (D-2A) had an average particle diameter of 4 μm, maximum particle diameter of 24 μm and the ratio of particles having a particle diameter in excess of 20 μm was 0.8% by weight.

[Chemical Formal 8]

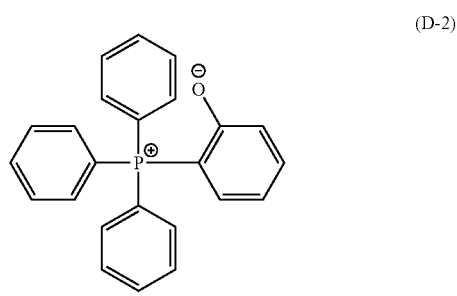

(D-2)

Curing accelerator (D-3B): Phosphonium silicate compound represented by the following formula (D-3) (average particle diameter: 32 μm, maximum particle diameter: 105 μm, ratio of particles having particle diameter in excess of 20 μm: 71% by weight)

Curing accelerator (D-3A): Obtained by finely crushing curing accelerator (D-3B) using a pot mill (Model II Pot Mill, Morita Iron Works Co., Ltd.) under conditions of a rotating speed of 60 rpm and crushing time of 60 minutes. The resulting curing accelerator (D-3A) had an average particle diameter of 8 μm, maximum particle diameter of 27 μm and the ratio of particles having a particle diameter in excess of 20 μm was 0.6% by weight.

[Chemical Formula 9]

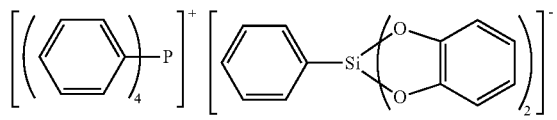

(D-3)

Curing Accelerator (D-4B): Tetraphenylphosphonium tetraphenylborate represented by the following formula (D-4) (average particle diameter: 20 μm, maximum particle diameter: 56 μm, ratio of particles having particle diameter in excess of 20 μm: 52% by weight)

Curing accelerator (D-4A): Obtained by finely crushing curing accelerator (D-4B) using a jet mill (PJM200SP, Nippon Pneumatic Mfg., Co., Ltd.) under conditions of pneumatic pressure of 0.6 MPa and raw material supply rate of 3 kg/h. The resulting curing accelerator (D-4A) had an average particle diameter of 5 μm, maximum particle diameter of 24 μm and the ratio of particles having a particle diameter in excess of 20 μm was 0.7% by weight.

[Chemical Formula 10]

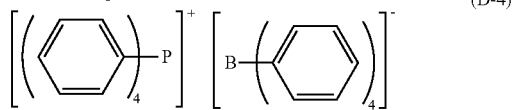

(D-4)

Curing Accelerator (D-5B): A phosphonium sulfinyl diphenolate compound represented by the following formula (D-5) (average particle diameter: 30 μm, maximum particle diameter: 69 μm, ratio of particles having particle diameter in excess of 20 μm: 56% by weight)

Curing accelerator (D-5A): Obtained by finely crushing curing accelerator (D-5B) using a jet mill (PJM200SP, Nippon Pneumatic Mfg., Co., Ltd.) under conditions of pneumatic pressure of 0.6 MPa and raw material supply rate of 3 kg/h. The resulting curing accelerator (D-5A) had an average particle diameter of 3 μm, maximum particle diameter of 24 μm and the ratio of particles having a particle diameter in excess of 20 μm was 0.4% by weight.

[Chemical Formula 11]

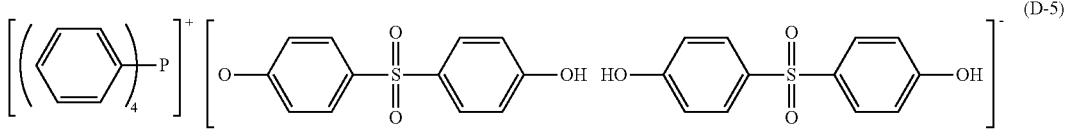

(D-5)

Example 1

44 parts by weight of epoxy resin (A-1):YX-4000, Mitsubishi Chemical Corp. (epoxy equivalent: 190 g/eq, melting point: 105° C.), 38 parts by weight of phenolic resin (B-1): XL-225, Mitsui Chemicals, Inc. (hydroxyl equivalent: 165 g/eq, softening point: 75° C.), 900 parts by weight of molten spherical silica (average particle diameter: 24 μm), 5 parts by weight of curing accelerator (D-1A), 5 parts by weight of silane coupling agent: γ-glycidoxypropyltrimethoxysilane (KBM-403, Shin-Etsu Chemical Co., Ltd.), 3 parts by weight of carbon black (#5, Mitsubishi Chemical Corp.) and 5 parts by weight of carnauba wax (Nikko Carnauba, Nikko Fine Co., Ltd.) were mixed with a mixer followed by kneading for 8 minutes at 95° C. using a heated roller, cooling and crushing to obtain an epoxy resin composition. The resulting epoxy resin composition was evaluated according to the methods described below. The results are shown in Table 1.

Evaluation Methods

Spiral flow: The epoxy resin composition was injected into a mold for measuring spiral flow in compliance with ANSI/ASTM D 3123-72 using a low-pressure transfer molding machine (KTS-15, Kohtaki Precision Machine Co., Ltd.) under conditions a mold temperature of 175° C., injection pressure of 6.9 MPa and curing time of 120 seconds, followed by measurement of flow length. Spiral flow is a parameter that indicates fluidity, and the larger the value of spiral flow, the better the fluidity. Units are in cm.

Mold release: Mold release was evaluated based on the ease of release from the mold during measurement of spiral flow. Spiral-shaped cured products able to be removed cleanly were evaluated as ○, those that broke during removal were evaluated as Δ, and those that adhered to the mold cavity were evaluated as X.

Curability: Torque after 45 seconds at 175° C. was measured using a curelastometer (JSR Curelastometer Model IVPS, Orientec Co., Ltd.). A large value for this torque indicates favorable curability.

Continuous moldability (air vent blockage): An 80-pin quad flat package (80pQFP, Cu lead frame, package outer dimensions: 14 mm×20 mm×2 mm thick, pad size: 6.5 mm×6.5 mm, chip size: 6.0 mm×6.0 mm×0.35 mm thick) was sealed and molded for up to 400 shots using a low-pressure transfer molding machine (GP-ELF, Daiichi Seiko Co., Ltd.) at a mold temperature of 175° C., injection pressure of 9.8 MPa and curing time of 70 seconds. Air vent blockage was evaluated to one of four levels by visually observing the mold for every 50 shots and confirming the presence or absence of air vent blockage (state in which air vents are blocked by adhesion of resin cured product to air vents (width: 0.5 mm, thickness: 50 μm)). Although the preferred order of air vent blockage is A, B, C, . . . , an evaluation of C or better is within the range of practical use. The evaluation criteria are indicated below.

A: No problems up to 400 shots
B: Occurrence of air vent blockage by 300 shots
C: Occurrence of air vent blockage by 200 shots
D: Occurrence of air vent blockage by 100 shots Adhesive strength with oxidized copper: An oxidized copper base material, in which the oxidation of the surface was allowed to progress by subjecting to heat treatment in air for 120 seconds at 220° C., and a tableted epoxy resin composition were integrally molded for 2 minutes under conditions of 175° C. and 6.9 MPa to obtain a molded product in the shape of a circular truncated cone (measuring 3 mm in upper diameter×3.6 mm in lower diameter×3 mm thick, contact surface area between oxidized copper base material and resin cured product: 10 mm² ) on the oxidized copper base material (diameter: 3.6 mm, thickness: 0.5 mm). Subsequently, the base material of each of the resulting molded products was immobilized and the cured site of the epoxy resin composition was pressed from the horizontal direction followed by measurement of that torque (N). This evaluation of adhesive strength has a certain degree of correlation with solder reflow resistance in a semiconductor, and evaluation criteria consisted of ○ for torque of 14 N or more, Δ for torque of 12 N or more and of less than 14N, and X for torque of less than 12 N.

Soldering resistance: A 100-pin TQFP (package size: 14 mm×14 mm, thickness: 1.4 mm, silicon chip size: 8.0 mm×8.0 mm, lead frames: copper and oxidized copper) were subjected to transfer molding using a low-pressure transfer molding machine (GP-ELF, Daiichi Seiko Co., Ltd.) at a mold temperature of 175° C., injection pressure of 6.9 MPa and curing time of 2 minutes followed by post-curing for 8 hours at 175° C. The molded package was allowed to stand for 168 hours in an environment having relative humidity of 85% followed by immersing in a solder bath at 240° C. for 10 seconds. Soldering resistance was expressed as the number of occurrences of external cracks and internal separation (in 10 samples) as observed with a microscope and ultrasonic tester. Furthermore, the oxidized copper lead frame was a lead frame in which oxidation of the surface was allowed to progress by subjecting a copper lead frame to heat treatment in air for 120 seconds at 220° C. based on the assumption of the thermal history of a stacked package.

Examples 2 to 6 and Comparative Examples 1 to 8

Epoxy resin compositions were prepared and evaluated for Examples 2 to 6 and Comparative Examples 1 to 8 in accordance with the formulations of Table 1 in the same manner as Example 1. The results are shown in Table 1.

The epoxy resin compositions of Examples 1 to 6 demonstrated extremely favorable fluidity (spiral flow), mold release, curability and continuous moldability, and since adhesive strength with oxidized copper was high, a semiconductor device in which a silicon chip was sealed with this epoxy resin composition allowed the obtaining of superior results for soldering resistance during IR reflow treatment following humidification treatment not only in the case of using an ordinary copper lead frame, but also in the case of using a copper lead frame in which oxidation has progressed.

INDUSTRIAL APPLICABILITY

According to the present invention, an epoxy resin composition for sealing, having superior fluidity, curability, continuous moldability and adhesion to a copper lead frame in which oxidation has progressed, and a highly reliable electronic component device, having superior soldering resistance even in the case of using a copper lead frame in which oxidation had progressed, were able to be obtained as indicated in the examples. Consequently, the present invention can be preferably used for electronic components such as IC or LSI, and particularly for packages susceptible to oxidation of the copper lead frame in the manner of multi-chip stacked packages (MCP) in which chips are laminated in multiple layers.

BRIEF DESCRIPTION OF THE REFERENCE SYMBOLS

1 Electronic component
2 Die attach material
3 Support member (die pad)
4 Bonding wire
5 Lead
6 Sealing resin (epoxy resin composition)
8 Electrode pad
9 Inner lead

TABLE 1

| Item | | | Examples | | | | | | Comparative Examples | | | | | | | |
|---|---|---|---|---|---|---|---|---|---|---|---|---|---|---|---|---|
| | | | 1 | 2 | 3 | 4 | 5 | 6 | 1 | 2 | 3 | 4 | 5 | 6 | 7 | 8 |
| Epoxy resin (A-1) | | | 44 | 82 | 44 | 82 | 44 | 82 | 44 | 82 | 44 | 44 | 44 | 44 | 44 | 44 |
| Phenolic resin (B-1) | | | 38 | 72 | 38 | 72 | 38 | 72 | 38 | 72 | 38 | 38 | 38 | 38 | 38 | 38 |
| Molten spherical silica | | | 900 | 825 | 900 | 825 | 900 | 825 | 900 | 825 | 900 | 900 | 900 | 900 | 900 | 900 |
| Curing accelerator (D-1A) | | | 5 | 8 | | | | | | | | | | | | |
| Curing accelerator (D-1B) | | | | | | | | | 5 | 8 | | | | | | |
| Curing accelerator (D-2A) | | | | | 5 | 8 | | | | | | | | | | |
| Curing accelerator (D-2B) | | | | | | | | | | | | 5 | | | | |
| Curing accelerator (D-3A) | | | | | | | 5 | 8 | | | | | | | | |
| Curing accelerator (D-3B) | | | | | | | | | | | 5 | | | | | |
| Curing accelerator (D-4A) | | | | | | | | | | | | | 5 | | | |
| Curing accelerator (D-4B) | | | | | | | | | | | | | | 5 | | |
| Curing accelerator (D-5A) | | | | | | | | | | | | | | | 5 | |
| Curing accelerator (D-5B) | | | | | | | | | | | | | | | | 5 |
| Silane coupling agent | | | 5 | 5 | 5 | 5 | 5 | 5 | 5 | 5 | 5 | 5 | 5 | 5 | 5 | 5 |
| Carbon black | | | 3 | 3 | 3 | 3 | 3 | 3 | 3 | 3 | 3 | 3 | 3 | 3 | 3 | 3 |
| Carnauba wax | | | 5 | 5 | 5 | 5 | 5 | 5 | 5 | 5 | 5 | 5 | 5 | 5 | 5 | 5 |
| Spiral flow | | | 90 | 135 | 96 | 144 | 102 | 154 | 88 | 131 | 93 | 100 | 106 | 131 | 94 | 122 |
| Mold release | | | ○ | ○ | ○ | ○ | ○ | ○ | Δ | X | Δ | Δ | Δ | X | ○ | ○ |
| Curability | | | 5.7 | 5.3 | 5.4 | 4.8 | 5.1 | 4.3 | 3.2 | 1.9 | 3.1 | 2.9 | 2.9 | 1.8 | 5.2 | 4.6 |
| Continuous moldability | | | A | A | A | A | A | A | B | D | B | C | C | D | A | A |
| Oxidized copper adhesive strength | Result | | ○ | ○ | ○ | ○ | ○ | ○ | Δ | X | X | X | X | X | Δ | X |
| | N | | 19 | 18 | 18 | 16 | 18 | 18 | 12 | 11 | 10 | 11 | 10 | 9 | 13 | 11 |
| Soldering resistance | Copper lead frame | Cracks | 0 | 0 | 0 | 0 | 0 | 0 | 0 | 0 | 0 | 0 | 2 | 3 | 0 | 0 |
| | | Separation | 0 | 0 | 0 | 0 | 0 | 0 | 0 | 0 | 0 | 0 | 2 | 2 | 0 | 0 |
| | Oxidized copper lead frame | Cracks | 0 | 0 | 0 | 0 | 0 | 1 | 2 | 3 | 2 | 2 | 9 | 10 | 1 | 2 |
| | | Separation | 0 | 0 | 0 | 1 | 0 | 1 | 5 | 10 | 7 | 6 | 10 | 10 | 5 | 6 |

The invention claimed is:

1. An epoxy resin composition for sealing, comprising: (A) an epoxy resin, (B) a phenolic resin-based curing agent, (C) an inorganic filler, and (D) a curing accelerator, wherein
the curing accelerator (D) has an average particle diameter of 10 μm or less, and the ratio of particles having a particle diameter in excess of 20 μm is 1% by weight or less, and
the curing accelerator (D) comprises at least one type of curing accelerator selected from the group consisting of a compound represented by the following general formula (1):

[Chemical Formula 1]

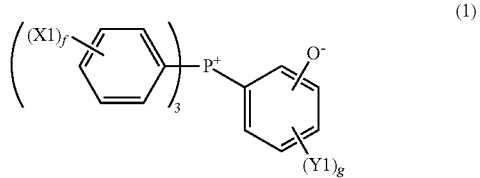

(1)

(wherein, P represents a phosphorous atom, X1 represents an alkyl group having 1 to 3 carbon atoms, Y1 represents a hydroxyl group, f represents an integer of 0 to 5, and g represents an integer of 0 to 3),
a compound represented by the following general formula (2):

[Chemical Formula 2]

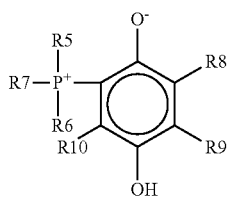

(2)

(wherein, P represents a phosphorous atom, R5, R6 and R7 represent alkyl groups having 1 to 12 carbon atoms or aryl groups having 6 to 12 carbon atoms and may be mutually the same or different, R8, R9 and R10 represent hydrogen atoms or hydrocarbon groups having 1 to 12 carbon atoms and may be mutually the same or different, and R8 and R9 may bond to form a cyclic structure), and
a compound represented by the following general formula (3):

[Chemical Formula 3]

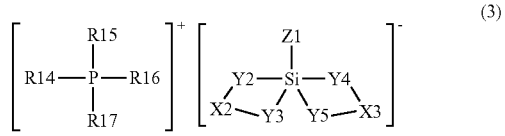

(3)

(wherein, P represents a phosphorous atom; Si represents a silicon atom; R14, R15, R16 and R17 respectively represent an organic group having an aromatic ring or heterocycle, or an aliphatic group, and may be mutually the same or different; X2 represents an organic group that bonds with groups Y2 and Y3; X3 represents an organic group that bonds with groups Y4 and Y5; groups Y2 and Y3 represent groups obtained by the release of a proton by a proton-donating group and groups Y2 and Y3 within the same molecule bond with a silicon atom to form a chelating structure; groups Y4 and Y5 represent groups obtained by the release of a proton by a proton-donating group and groups Y4 and Y5 within the same molecule bond with a silicon atom to form a chelating structure; X2 and X3 may be mutually the same or different; groups Y2, Y3, Y4 and Y5 may be mutually the same or different; and Z1 represents an organic group having an aromatic ring or heterocycle, or an aliphatic group).

2. The epoxy resin composition for sealing according to claim 1, wherein adhesive strength with oxidized copper as determined in the measurement experiment described below is 14 N or more:
<Measurement Experiment>
After integrally molding an oxidized copper base material, in which oxidization of the surface has progressed as a result of subjecting to heat treatment in air at 220° C. for 120 seconds, and the tableted epoxy resin composition under conditions of 175° C. and 6.9 MPa for 2 minutes to obtain a molded product in the shape of a circular truncated cone (measuring 3 mm in upper diameter×3.6 mm in lower diameter×3 mm thick, contact surface area between oxidized copper base material and resin cured product: 10 mm$^2$) on the oxidized copper base material (diameter: 3.6 mm, thickness: 0.5 mm), the cured site of the epoxy resin composition was pressed from the horizontal direction followed by measurement of that torque (N).

3. The epoxy resin composition for sealing according to claim 1, for applying to a copper surface or oxidized copper surface.

4. The epoxy resin composition for sealing according to claim 1, wherein the inorganic filler (C) contains molten spherical silica having an average particle diameter of 10 μm to 30 μm.

5. The epoxy resin composition for sealing according to claim 1, wherein the molten spherical silica is contained at a ratio of 82% by weight to 92% by weight in the entire resin composition.

6. The epoxy resin composition for sealing according to claim 1, wherein the epoxy resin (A) contains a bifunctional crystalline epoxy resin.

7. An electronic component device, comprising: an electronic component sealed by a cured product of the epoxy resin composition for sealing according to claim 1.

8. The electronic component device according to claim 7, wherein the electronic component is mounted on a die pad of a copper lead frame, and the electrode pad of the electronic component and the inner lead of the copper lead frame are connected by a bonding wire.

9. The electronic component device according to claim 8, wherein two or more of the electronic components are mounted by laminating on the die pad of the copper lead frame.

10. The epoxy resin composition for sealing according to claim 2, for applying to a copper surface or oxidized copper surface.

11. The epoxy resin composition for sealing according to claim 2, wherein the inorganic filler (C) contains molten spherical silica having an average particle diameter of 10 μm to 30 μm.

12. The epoxy resin composition for sealing according to claim 3, wherein the inorganic filler (C) contains molten spherical silica having an average particle diameter of 10 μm to 30 μm.

13. The epoxy resin composition for sealing according to claim 2, wherein the molten spherical silica is contained at a ratio of 82% by weight to 92% by weight in the entire resin composition.

14. The epoxy resin composition for sealing according to claim 3, wherein the molten spherical silica is contained at a ratio of 82% by weight to 92% by weight in the entire resin composition.

15. The epoxy resin composition for sealing according to claim 4, wherein the molten spherical silica is contained at a ratio of 82% by weight to 92% by weight in the entire resin composition.

16. The epoxy resin composition for sealing according to claim 2, wherein the epoxy resin (A) contains a bifunctional crystalline epoxy resin.

17. The epoxy resin composition for sealing according to claim 3, wherein the epoxy resin (A) contains a bifunctional crystalline epoxy resin.

18. The epoxy resin composition for sealing according to claim 4, wherein the epoxy resin (A) contains a bifunctional crystalline epoxy resin.

19. The epoxy resin composition for sealing according to claim 5, wherein the epoxy resin (A) contains a bifunctional crystalline epoxy resin.

20. An electronic component device, comprising: an electronic component sealed by a cured product of the epoxy resin composition for sealing according to claim 2.

* * * * *